(12) United States Patent
Naviasky et al.

(10) Patent No.: US 9,490,795 B1
(45) Date of Patent: Nov. 8, 2016

(54) SYSTEM AND METHOD FOR SELECTIVELY COUPLED PARASITIC COMPENSATION FOR INPUT REFERRED VOLTAGE OFFSET IN ELECTRONIC CIRCUIT

(71) Applicant: CADENCE DESIGN SYSTEMS, INC., San Jose, CA (US)

(72) Inventors: Eric Naviasky, Ellicott City, MD (US); Ali Ulas Ilhan, Elkridge, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/829,070

(22) Filed: Aug. 18, 2015

(51) Int. Cl.
*H03K 17/16* (2006.01)
*H03K 17/14* (2006.01)

(52) U.S. Cl.
CPC .................................. *H03K 17/145* (2013.01)

(58) Field of Classification Search
None
See application file for complete search history.

(56) References Cited

U.S. PATENT DOCUMENTS

| | | | | |
|---|---|---|---|---|
| 4,365,204 A | * | 12/1982 | Haque | H03F 3/005 327/337 |
| 7,408,398 B2 | * | 8/2008 | Sander | H03K 17/162 327/427 |
| 2011/0032003 A1 | * | 2/2011 | Lee | G11C 27/026 327/94 |
| 2013/0033302 A1 | * | 2/2013 | Ali | H03K 17/00 327/437 |

* cited by examiner

*Primary Examiner* — Long Nguyen
(74) *Attorney, Agent, or Firm* — Rosenberg, Klein & Lee

(57) ABSTRACT

A system and method are provided for selectively coupled parasitic compensation for voltage offset in an electronic circuit. At least one compensation cell is coupled to an input stage for the circuit. The compensation cell includes an isolation node disposed in spaced manner from control and sampling nodes defined by the input stage. The isolation node is configured to form first and second parasitic capacitances respectively with the control and sampling nodes during system operation. An offset switch is coupled to the isolation node and selectively set between first and second switching states. The offset switch selectively either maintains or interrupts a series coupling of the first and second parasitic capacitances between the control and sampling nodes; and, the sampling node is thereby adaptively adjusted in voltage by a predetermined portion of a control signal applied to the control node.

20 Claims, 10 Drawing Sheets

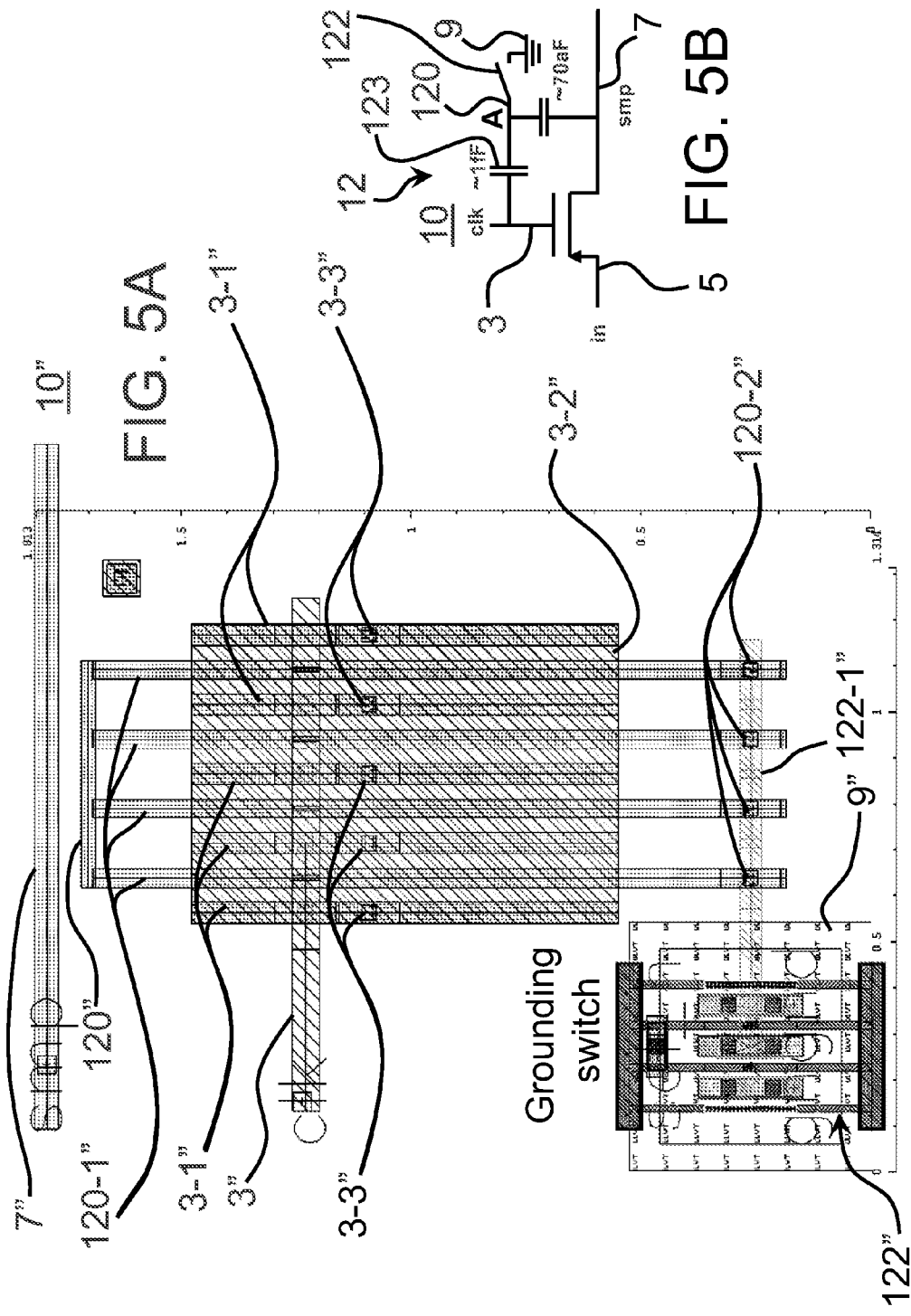

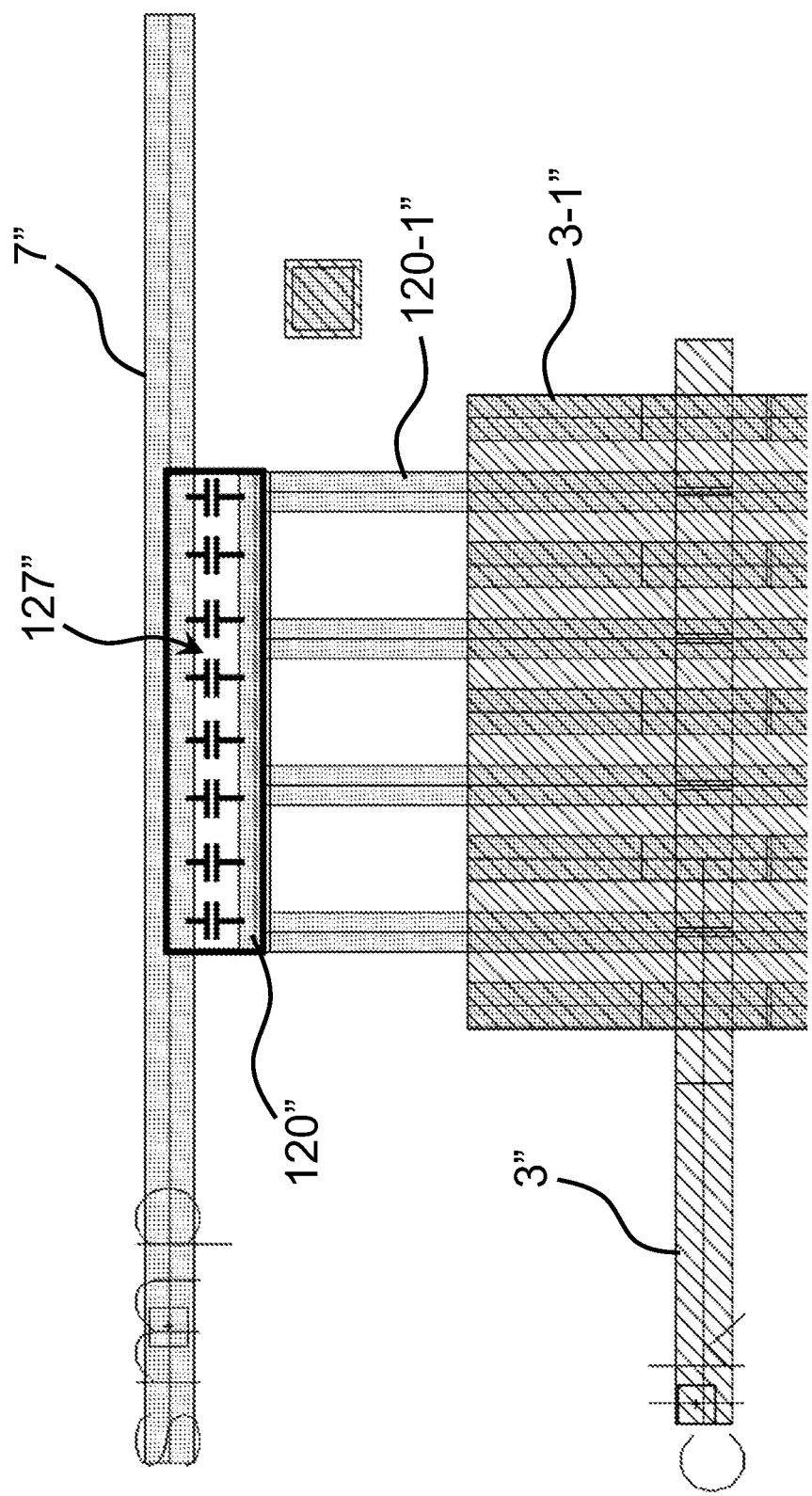

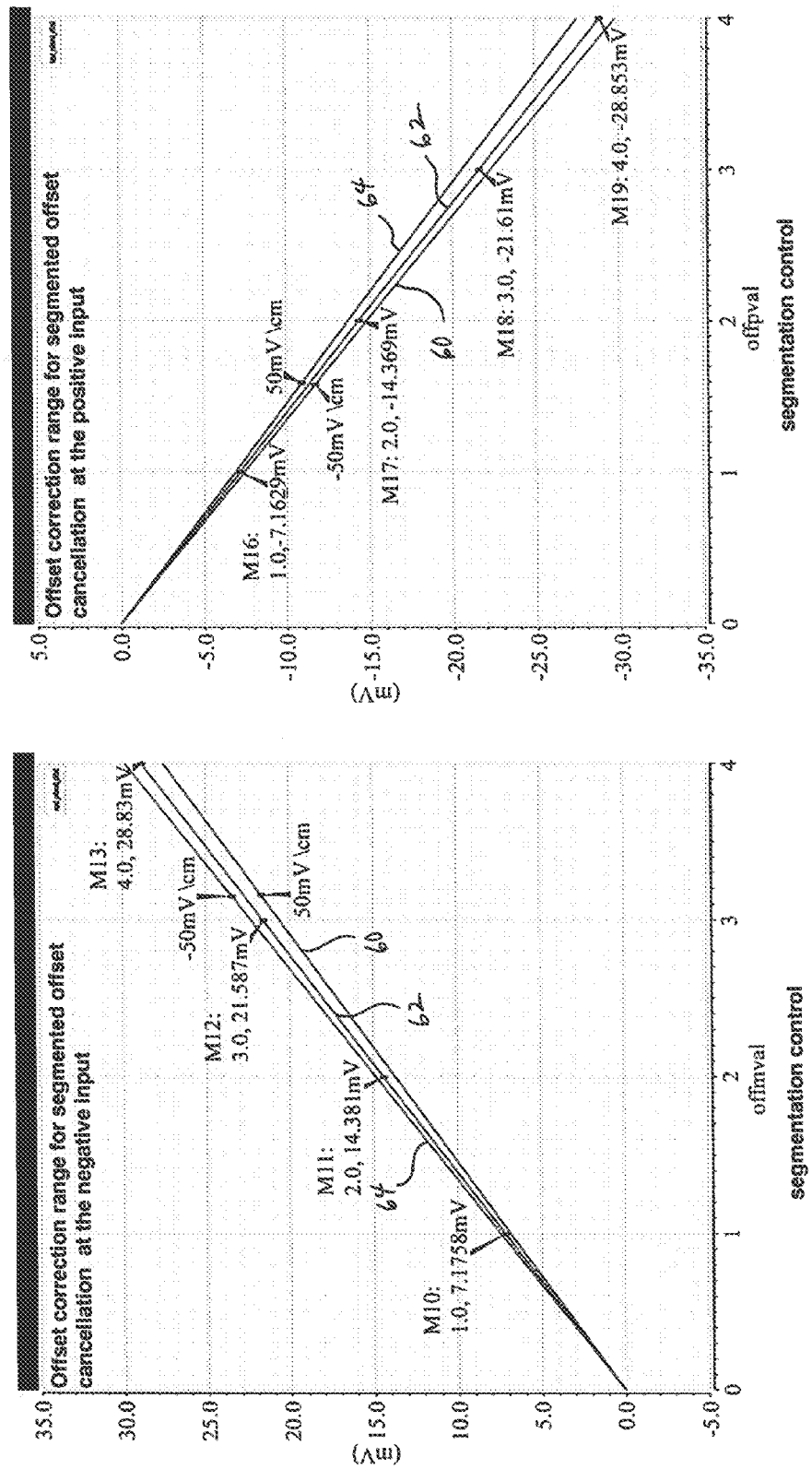

SYSTEM AND METHOD FOR SELECTIVELY COUPLED PARASITIC COMPENSATION FOR INPUT REFERRED VOLTAGE OFFSET IN ELECTRONIC CIRCUIT

BACKGROUND OF THE INVENTION

The subject system and method are generally directed to cancelling voltage offset effects encountered of electronic circuits during operation. More specifically, the subject system and method provide pre-compensation for such effects at one or more inputs of electronic circuits, and do so in a manner that productively harnesses the normally unwanted stray effects of parasitic capacitance.

The ongoing trend towards increasingly smaller geometries in the integration of electronic circuits enables greater capabilities, but also presents greater challenges to proper implementation and use. Extremely high speed circuit designs are made possible by high speed transistor devices integrated with increasingly shorter channel lengths. These circuit designs are typically laid out and printed on substrates using electronic design automation (EDA) measures. They require smaller device loading (lower input impedance levels) to minimize power consumption and maximize bandwidth for given applications. The minute device geometries involved in these applications lead to so-called offsets in certain operating parameters whose values should ideally match for optimum circuit performance.

These parametric offsets may be due in different degrees to various factors, including manufacturing process mismatch and other errors/distortions due to non-ideal realization of given systems. An offset in terms of voltage reflects the systematic distortion of an electronic circuit's response to an input signal(s). The offset is said to be 'input referred' when the offset is expressed in terms of the deviation required in the circuit's input voltage for an ideal/noiseless version of the circuit to produce the same distorted response.

Such offsets are increasingly troublesome for applications involving faster switching/operating speeds and smaller device geometries. They necessitate costly tradeoffs, especially in systems employing certain types of circuits which by virtue of their architectural features and component make up are particularly vulnerable to offset effects. Systems employing comparator circuits, for instance, are known to have considerable voltage offset. Consequently, systems such as SerDes (so-called serializers/deserializers) must commit more of their error budgets to voltage offsets. Especially at heightened serial link speeds necessitating greater front end gain, the resulting offsets consume excessively large portions of the vertical eye opening. In so-called data slicer systems designed for high speed operation the offset typically consumes up to 10-20 percent of the vertical eye opening budget.

In comparator circuits employed by these and other high speed applications, voltage offset causes the signals received at the circuit's compared inputs to be 'seen' shifted in difference by that voltage offset amount. As a result, two input signals of like voltage may be taken mistakenly by the comparator circuit as having a voltage difference when none actually exists. The mistaken shift constitutes the circuit's voltage offset.

An input referred voltage offset of an electronic circuit encountered at an input of that circuit may be compensated for by applying a voltage adjustment sufficient in amplitude and polarity on the input signal there sufficient to cancel the voltage offset. Yet, accomplishing this without excessively encumbering implementation and operational factors has heretofore remained a challenge.

Attempts have been made in the art to cancel voltage offset in comparator circuits. In one known approach, illustrated in FIG. 8, a bank of active devices are employed to inject a selected amount of current to the drain of the field effect transistor (FET) serving as the input sampling switch at each input stage. But this approach is notably prone to considerable temperature drift during system operation. Also, the numerous active devices employed in the multiple current injection stages at each of the input switching transistors not only increase physical size which consumes precious chip area, they present numerous gates and heavy clock signal loading which consume considerable power.

There is therefore a need for a system and method for simply yet effectively compensating for input referred voltage offset of an electronic circuit without excessive temperature drift, large size, undue loading, or other such drawbacks.

SUMMARY OF THE INVENTION

It is an object of the present invention to provide a system and method for simply yet effectively compensating for voltage offset of an electronic circuit.

It is another object of the present invention to provide a system and method for cancelling input referred voltage offset of an electronic circuit in a manner resistant to temperature drift.

It is yet another object of the present invention to provide a system and method which minimize size and loading of preceding circuit stages.

These and other objects are attained in a system and method for selectively coupled parasitic compensation for input referred voltage offset in an electronic circuit. The system comprises at least one input stage for the electronic circuit, and at least one compensation cell coupled to each input stage. Each input stage includes a sampling switch controlled by a periodic control signal applied thereto at a control node to selectively pass an input signal to a sampling node. A hold capacitance is coupled between the sampling node and a voltage reference node. The compensation cell includes an isolation node disposed in spaced manner from the control and sampling nodes. The isolation node is configured to form first and second parasitic capacitances respectively with the control and sampling nodes during system operation. An offset switch is coupled to the isolation node and selectively set between first and second switching states. The offset switch in the first switching state maintains a series coupling of the first and second parasitic capacitances between the control and sampling nodes; and, the sampling node is thereby adaptively adjusted in voltage by a predetermined portion of the control signal. The offset switch in the second switching state couples each of the first and second parasitic capacitances to the voltage reference node to interrupt the series coupling thereof.

A system is formed in certain embodiments for programmable parasitic cancellation of input referred voltage offset in a printed electronic circuit having a predetermined layout of devices interconnected by nets routed on at least one circuit substrate. The system comprises at least one input stage for the printed electronic circuit, with each input stage including a sampling switch controlled by a periodic clock signal applied thereto at a control node to selectively pass an input signal to a sampling node. Each input stage also includes a hold capacitance coupled between said sampling node and a voltage reference node. A plurality of compensation cells are coupled to each input stage. Each compensation cell includes an isolation node disposed in spaced manner from the control and sampling nodes, and an offset switch is coupled to the isolation node and selectively configured between first and second switching states. The isolation node is configured to form first and second parasitic capacitances respectively with the control and sampling nodes during system operation. The isolation node is defined by at least one metallic trace formed on a first printed circuit substrate in predetermined geometric configuration and arrangement with respect to the control and sampling nodes. The offset switch in the first switching state maintains a series coupling of the first and second parasitic capacitances between the control and sampling nodes. The sampling node is thereby adaptively adjusted in voltage by a predetermined portion of the clock signal. The offset switch in the second switching state couples each of the first and second parasitic capacitances to the voltage reference node to interrupt the series coupling thereof. The compensation cells are enabled in different combinations by selectively configuring the offset switches thereof to programmably adjust the sampling node in voltage by a corresponding portion of the clock signal.

A method is realized in accordance with certain embodiments of the present invention for selectively coupled parasitic compensation of input referred voltage distortion in an electronic circuit. The method comprises establishing at least one input stage for the electronic circuit, each input stage including a sampling switch coupled to a control node and a hold capacitance coupled between a sampling node and a voltage reference node. An isolation node is disposed in spaced manner from each of the control and sampling nodes. The isolation node is geometrically configured, and the isolation node is arranged to form during system operation a first parasitic capacitance with the control node and a second parasitic capacitance with the sampling node. An offset switch is coupled to the isolation node, the offset switch being selectively configured between first and second switching states to form a compensation cell for the input stage. A periodic clock signal is applied at the control node to actuate the sampling switch for selectively passing an input signal to the sampling node. The offset switch is selectively set to the first switching state to maintain a series coupling of the first and second parasitic capacitances between the control and sampling nodes, whereby the sampling node is adaptively adjusted in voltage by a predetermined portion of the clock signal. The offset switch is alternatively actuated to the second switching state to couple each of the first and second parasitic capacitances to the voltage reference node and thereby interrupt the series coupling thereof.

BRIEF DESCRIPTION OF THE DRAWINGS

FIG. 5A is a graphic representation of a magnified physical layout for implementing a compensation cell in one portion of the embodiment shown in FIG. 1;

FIG. 5B is a schematic diagram of the compensation cell portion corresponding to the physical layout graphically represented in FIG. 5A;

FIG. 5C is a zoomed in, partially cut away, view of the physical layout graphically represented in FIG. 5A, shown with explanatory graphic annotation at one portion of the view;

FIG. 6A is a graphic plot of results obtained from simulated sample operation of the embodiment shown in FIG. 3, illustrating variation of offset cancellation voltage according to number of activated compensation cell segments for a minus-side input;

FIG. 6B is a graphic plot of results obtained from simulated sample operation of the embodiment shown in FIG. 3, illustrating variation of offset cancellation voltage according to number of activated compensation cell segments for a plus-side input;

DETAILED DESCRIPTION OF THE PREFERRED EMBODIMENTS

Figure 1:
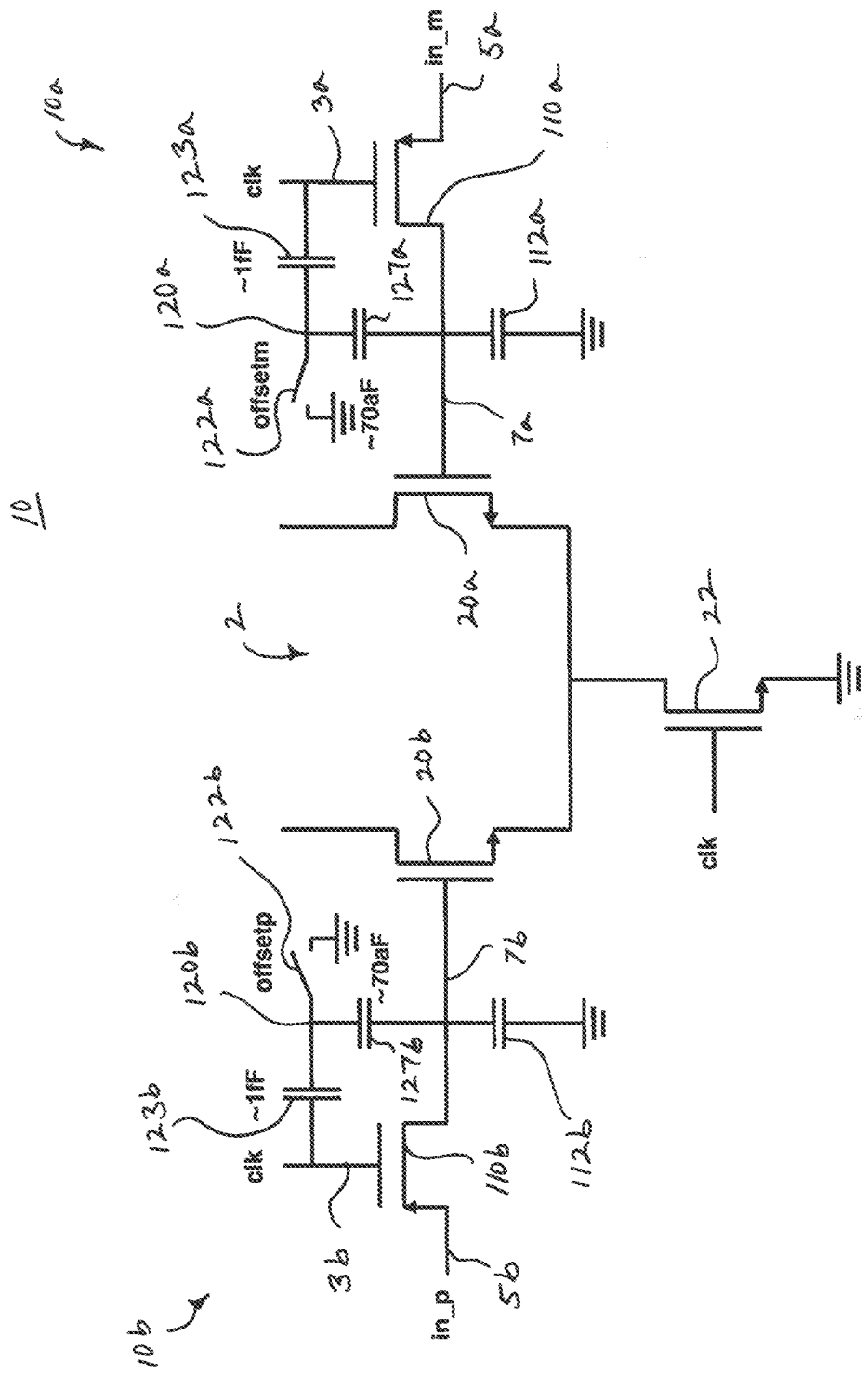
FIG. 1 is a schematic diagram illustrating a system formed in accordance with one exemplary embodiment of the present invention, as applied to an electronic circuit in one illustrative application.

The subject system and method are generally directed to cancelling input-referred voltage offset in various electronic circuits. The subject system and method employ measures to utilize and control the stray capacitance effects that arise from the close spacing of metallic members of a circuit laid out on one or more substrate layers. The measures employed in this manner are largely immune to temperature drift, and occupy sufficiently small area on the circuit that residual parasitic effects are largely avoided. They are employed in such manner that effective impedance that kept low enough to keep from unduly loading preceding circuit stages.

Briefly, the subject system and method provide for measures incorporated at one or more input stages of a given electronic circuit to productively utilize the parasitic capacitance which forms between conductive members laid out in close proximity to one another there. Suitable switching measures are provided at the given input stage(s) to selectively establish or interrupt a series coupling of the parasitic capacitances prevailing between certain proximately disposed conductive members. In this way, a compensation cell may be realized at an input stage, by which a periodic signal applied at a node displaced from a sampling node is capacitively coupled to that sampling node—in parasitic yet controlled manner. Depending on the particularities of the given circuit and system/method implementation, then, charge of positive or negative polarity is effectively injected into the sampling node, whereby an input signal sampled at that node is adjusted accordingly in voltage. The input signal at an input stage is thereby pre-compensated as needed to cancel the effects of the electronic circuit's voltage offset to be encountered.

The degree of voltage adjustment (or offset cancellation) thus applied by a compensation cell to a signal at the sampling node may be controlled by suitably configuring the relative dimensional and spatial aspects of the nodes and other conductive members between which the cell's parasitic capacitances form. Preferably, the capacitively coupled signal is a periodic control signal applied at a control node of the given input stage, and the resulting configuration is such that the degree of voltage adjustment is set to a certain predetermined proportion of the control signal. If one compensation cell is said to provide one bit weight of voltage adjustment at an input stage, a plurality of such offset cells may be provided at the same input stage (across the control and sampling nodes) to provide a programmable range of adjustment. Each compensation cell could then be selectively enabled as needed to provide different bit weights of voltage adjustment/offset cancellation.

A system formed in accordance with an exemplary embodiment of the present invention may be used in connection with various types of electronic circuits in numerous different applications. Examples include a comparator circuit used in high speed applications, where differential signaling is often utilized, passing data through paired signal components whose difference reflects the transmitted information. In one type of high speed application, a differential signal's components are received through separate input stages of a comparator circuit for mutual comparison. In comparators having so-called strobed comparator architecture, for example, a periodic control signal in the form of a clock signal is applied to the control terminal of an input, or sampling, switch coupled to a sampling node at each input stage for a differential signal component. A hold capacitor coupled to the sampling node at each of the input stages charges to the signal applied to the sampling node while the clock signal keeps the input switch turned on. When the clock signal turns off the two input switches, the charged capacitors hold the input signals sampled on the sampling node. The comparator circuit is strobed according to the same clock signal to make a comparison decision.

By way of explanatory example, FIG. 1 illustrates in simplified schematic form a system 10 formed in accordance with one exemplary embodiment of the present invention, as implemented in connection with such a strobed comparator circuit. The system 10 is not limited in application to just strobed comparator circuits, and may in other embodiments and applications be suitably employed in other types of comparator circuits having need for voltage offset compensation. Indeed, the system 10 may be suitably configured and employed in circuits of various other type and/or configuration known in the art having such need for offset compensation.

The strobed comparator circuit in the illustrated example is employed in a high speed data slicer application, where successive bits of incoming components of a differential signal transmitted across a serial link are received and compared for de-serialized recovery of their digital form. As will be apparent to those skilled in the art, this is but one exemplary embodiment and application of the present invention, and the present invention is not limited thereto. A system formed in accordance with certain aspects of the present invention may be suitably adapted for various other applications where simple yet effective cancellation of input-referred voltage offset is required.

As shown, the system 10 is configured in the illustrated example to provide selectively coupled parasitic compensation for input referred voltage offset in a strobed comparator circuit 2. The strobed comparator circuit 2 (partially cut away for brevity and clarity of illustration) includes differential transistors 20a, 20b formed in this example by a pair of N-channel MOSFET (metal-oxide field effect transistor) devices whose gate terminals are coupled to respective input stages of the system 10 receiving respective differential signal components. Comparator decisions of the circuit 2 are carried out at predetermined intervals, as strobed by a periodic clock signal clk applied to control a strobe switching device 22 (also formed in this embodiment by an N-channel MOSFET device).

The system 10 includes at least one input stage for the given circuit. In this example, system 10 includes a pair of input stages to serve the comparator circuit 2, and the system is incorporated at the input stages as portions 10a, 10b. The paired input stages in this example operate to sample and hold differentially paired signals in_m and in_p applied to respective minus- and plus-side input nodes 5a, 5b. Each input stage includes an input switching device 110a, 110b formed for instance in the illustrated embodiment by a P-channel MOSFET device, connected as shown with its source terminal coupled to the input node 5a, 5b, source terminal coupled to a sampling node 7a, 7b, and gate terminal coupled to a control node 3a, 3b. At least one, preferably both, of the input stages also includes one or more compensation cells for selectively imparting a controlled degree of parasitically derived voltage compensation to the input signal in_m, in_p as sampled and made available by hold capacitor 112a, 112b at the sampling node 7a, 7b.

Each compensation cell of an input stage includes an isolation node 120a, 120b formed by one or more conductive members disposed in close proximity to—but spaced from—the control and sampling nodes 3a, 3b and 7a, 7b, and an offset switch 122a, 122b coupled to the isolation node 120a, 120b. The isolation node 120a, 120b is physically shaped, dimensioned, and arranged with respect to the control and sampling nodes 3a, 3b and 7a, 7b to form a first parasitic capacitance 123a, 123b with the control node 3a, 3b and a second parasitic capacitance 127a, 127b with the sampling node 7a, 7b during system operation. The offset switch 122a, 122b is formed by a suitable switching device known in the art to actuate between first and second switching states as needed for proper voltage offset compensation. The offset switch 122a, 122b in one switching state connects the isolation node 120a, 120b to a voltage reference node such as system ground, and in another switching state disconnects the isolation node 120a, 120b from the voltage reference node.

The same clock signal clk which strobes the comparator decisions of circuit 2 is applied at the control node 3a, 3b of each input stage in the illustrated example. With the offset 122a, 122b switch disconnecting the isolation node 120a, 120b from ground, the parasitic capacitances 123a and 127a, 123b and 127b are effectively coupled in series between the control and sampling nodes 3a, 3b and 7a, 7b. The clock signal clk is capacitively coupled to the sampling node 7a, 7b; and, the voltage at that sampling node 7a, 7b is accordingly adjusted subject to the capacitive divider effects which result under AC conditions. Effectively, the charge injected by the clock signal's capacitive coupling results in capacitive division of the clock signal clk voltage to ground through the series coupled parasitic capacitances 123a, 123b and 127a, 127b, then through the hold capacitance of the given input stage. The voltage established at the sampling node 7a, 7b according to this capacitive division, and reflects a voltage adjustment effectively combined with the input-sampled voltage. With the offset 122a, 122b switch conversely connecting the isolation node 120a, 120b to ground, the series coupling of parasitic capacitances 123a and 127a, 123b and 127b is interrupted, nullifying this compensatory adjustment of voltage at the sampling node 7a, 7b.

The degree and polarity of adjustment are determined by the parametric properties of the system as implemented in the particularly intended application. Preferably, the parametric configurations (shape, size, spatial arrangement and separation, or the like) of the control/sampling nodes 3a, 3b, 7a, 7b, the isolation node 120a, 120b, and other elements of the input stage and compensation cell are predefined to suit the particular requirements of the intended application. The parametric configurations are determined automatically, preferably using an electromagnetic field solver or any other such suitable tool known in the art, so that the degree of voltage compensation required to sufficiently cancel the given electronic circuit's input-referred voltage offset is realized either wholly or incrementally by one or more compensation cells.

In the sample case shown for the illustrated embodiment, system 10 is parametrically configured to effectively establish first and second parasitic capacitances 123a, 123b and 127a, 127b of approximately 1 femtoFarad ($10^{-15}$ Farad) and approximately 70 attoFarad (or $70 \times 10^{-18}$ Farad) during system operation. Each system portion 10a, 10b is effectively 'tuned' in configuration this way so that the first parasitic capacitance 123a, 123b of each compensation cell is preferably much greater (more than 10 times greater in this sample case) than the second parasitic capacitance 127a, 127b. The resulting capacitive division then cause a sufficiently scaled portion of the clock signal voltage to be imparted, effectively, at the sampling node 7a, 7b, the scaled portion being on the order of the input referred voltage offset being cancelled.

The sample capacitance values illustrated in the cases shown in FIG. 1 and elsewhere are just that—sample case values shown for illustrative purposes only. Those skilled in the art will readily recognize that the present invention is not limited to like or even similar values, as the actual capacitance values employed (even with the system embodiment as shown) will depend on the particular requirements of the intended application.

Figure 2:
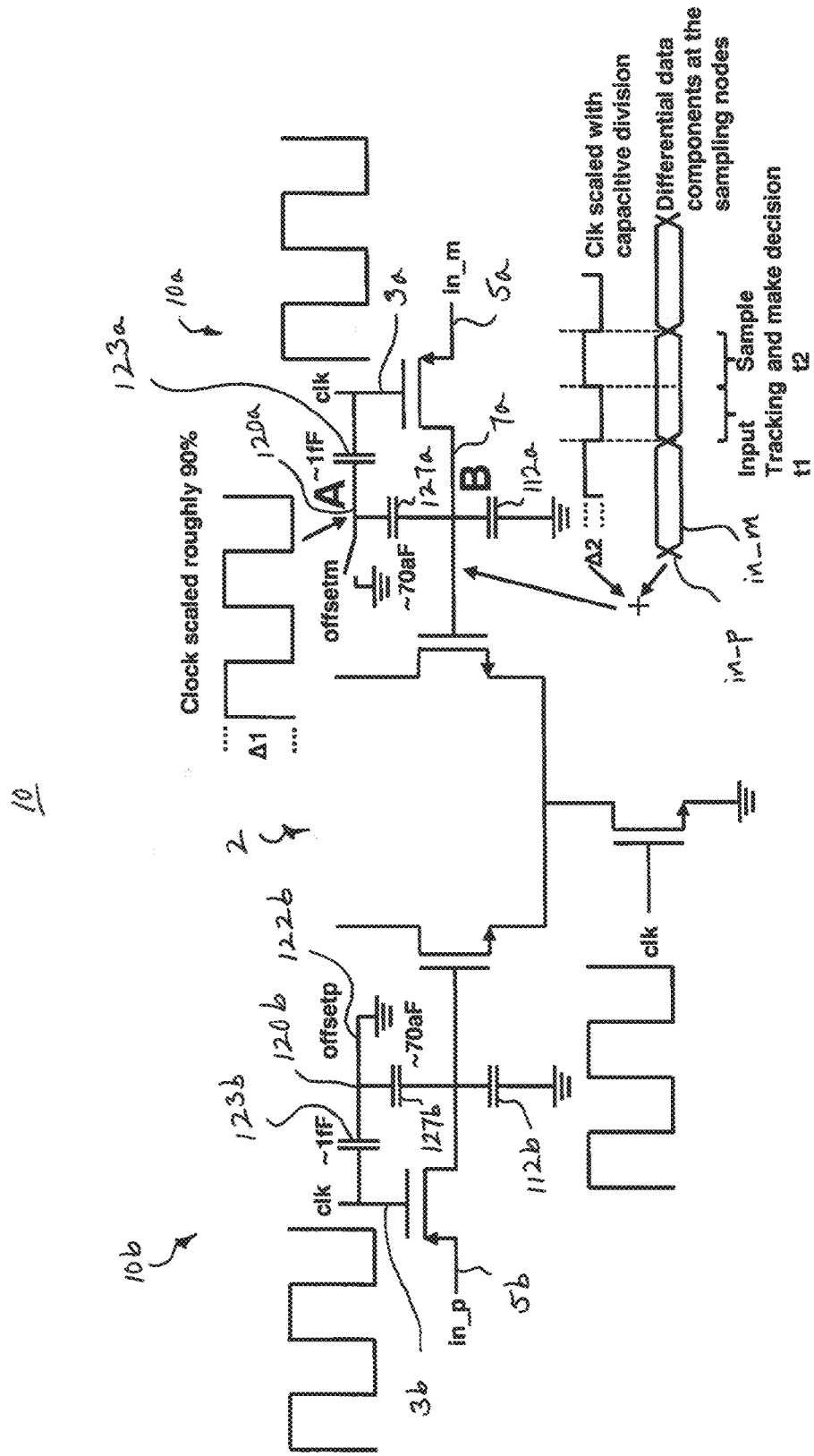
FIG. 2 is a graphically annotated schematic diagram illustrating sample operation of the embodiment shown in FIG. 1.

Referring to FIG. 2, the scaling effect on the clock signal portion capacitively coupled to the sampling node 7a, 7b in each system portion 10a, 10b is illustrated by the annotations there shown. In this particular case, the same embodiment and application as illustrated in FIG. 1 is shown with only the offset switch 120a of the compensation cell in system portion 10a set to an open switching state, whereby the isolation node 120a remains floating. The offset switch 120b of the system portion 10b at the other input stage is set to a closed switching state, which in this case connects the isolation node 120b to system electrical ground. As a result, the compensation cell is enabled only in system portion 10a for the minus input signal in_m. The compensation cell of the system portion 10b at the plus-side input stage is effectively disabled.

The clock signal clk applied at the control nodes 3a, 3b is formed in the example shown by a square wave signal having a certain predetermined peak voltage. Each of the input stages is configured with the switching devices in this example to effect a rising edge-triggered sample and hold. So when the clock signal clk goes low, it turns on the input switches 110a, 110b, and the input signal components in_m, in_p applied at the input nodes 5a, 5b are passed respectively to the sampling nodes 7a, 7b to charge the hold capacitances 112a, 112b connected thereto. When this clock signal clk goes high, the input switches 110a, 110b are turned off, and to the extent they are charged, the hold capacitances 112a, 112b maintain the respective input signal voltages at the sampling nodes 7a, 7b. If the voltage at a sampling node 7a, 7b is sufficiently high, the corresponding N-channel MOSFET 20a, 20b of the comparator circuit 2 turn on for comparator decision (whose strobing is synchronized thereto by the same clock signal clk turning on the comparator circuit's strobe switch 22).

At the time instant shown in FIG. 2, offset compensation is disabled at the p-side system portion 10b (by setting the offset switch 122b to tie the isolation node 120b to ground), while offset compensation is enabled at the m-side system portion 10a (by setting the offset switch 122a to disconnect the isolation node 120b from ground). Enabling offset compensation at the m-side system portion 10a permits series coupling between that portion's parasitic capacitances 123a, 127a as part of the system portion's AC response. Capacitive division of the clock signal clk voltage occurs over these parasitic capacitances combined with the m-side hold capacitance coupled to the sampling node 7a. At the isolation node 120a (marked "A"), then, the clk voltage is scaled down for example to roughly 90% of its original voltage in the particular case shown. At the sampling node 7a (marked "B") the scaled clk voltage is further scaled down to a voltage that equates to the sum of the compensation voltage $\Delta 2$ and the sampled input voltage. The sampled input voltage at this the m-side system portion 10a would be just the minus input signal component in_m, as sampled by the m-side hold capacitance (although annotated graphic in FIG. 2 shows for brevity both the minus and plus signal components of the differential input signal waveform).

Preferably, the system 10 is so configured that the compensation voltage $\Delta 2$ equals or substantially approaches the input-referred voltage offset of the given electronic circuit (comparator circuit 2 in the illustrated example) as seen from a given input stage. Where a plurality of compensation cells are employed for the same input stage in order to segment the offset compensation, the compensation voltage $\Delta 2$ would preferably span the combined total of all segmented adjustment increments contributed by the compensation cells (or the collective total of the least significant bit, LSB, adjustment contributed individually by of each of the compensation cells). The compensation voltage $\Delta 2$ when applied to the sample input signal then pre-compensates that input signal for the voltage offset to be encountered in the given electronic circuit. Such compensation applied at the in-side input stage of the comparator circuit 2 shown in the illustrated example essentially removes the circuit's built-in skew in comparing the differential inputs. The compared inputs are thereby equalized but for differences actually due to data/information content carried between the compared signal components.

Figure 3:
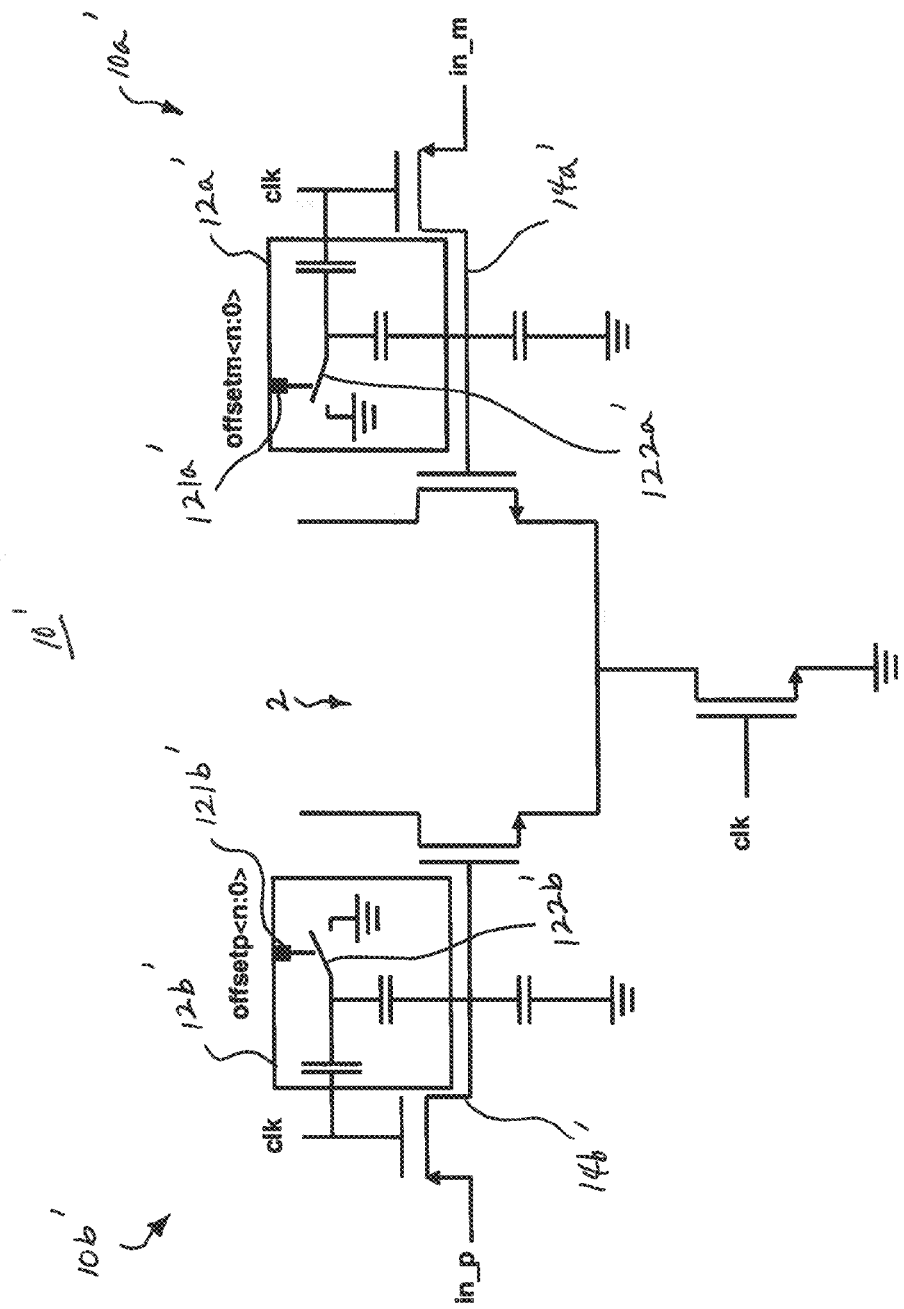
FIG. 3 is a schematic diagram illustrating a system formed in accordance with another exemplary embodiment of the present invention, as applied to an electronic circuit in one illustrative application.

Referring to FIG. 3, there is schematically shown a system 10' formed in accordance with another exemplary embodiment of the present invention similar in configuration and application to the embodiment of FIGS. 1-2. As in that embodiment, system 10' is implemented in connection with a strobed comparator circuit 2 employed in a high speed data slicer application. In this embodiment, however, each of the m-side and p-side system portions 10a', 10b' includes a plurality of compensation cells 12a', 12b' coupled in parallel to its sample and hold input stage 14a', 14b'. The structure and intercoupling (with the clock signal clk—controlled input stage) of each individual compensation cell 12a', 12b' are as in the preceding embodiment (of FIGS. 1-2), except that the offset switch 122a', 122b' of each compensation cell 12a', 12b' is shown equipped with a selectively addressable activation terminal 121a', 121b'. With a bank of n compensation cells 12a', 12b' each parametrically 'tuned' to provide a certain incremental voltage adjustment, a predetermined compensation voltage range may be segmented over n addressable bits of compensatory adjustment providing n+1 steps of adjustment/correction.

The parasitic compensation afforded by system 10' may be programmably applied with an adjustment resolution controlled by setting the predetermined compensation voltage range and number n of compensation cells 12a', 12b' accordingly. The degree of compensation may be programmed by addressably activating the appropriate set of compensation cells 12a', 12b' via an n bit digital word. Depending on the requirements of the particularly intended application, the predetermined compensation voltage range may be evenly segmented, such that each addressable compensation cell 12a', 12b' contributes a substantially uniform incremental voltage adjustment when activated (approximately $1/n^{th}$ of the desired compensation voltage range). Alternatively, the predetermined compensation voltage range may be segmented into increments of differing size (such that one or more cells 12a', 12b' contribute an LSB adjustment increment, or bit weight, and one or more of the other cells contributed greater, more significant, adjustment increment(s)). The bit weight may be varied by suitably varying the size and other physical attributes of each cell.

Moreover, the predetermined compensation voltage range may be variously set, depending on the requirements of the particularly intended application. The compensation range may be set, for example, to the compensation voltage Δ2 required to wholly cancel the characteristic voltage offset of the comparator circuit 2. The compensation range may be expanded beyond the compensation voltage Δ2, for instance, to a multiple or some other range greater than that compensation voltage Δ2 to preserve ample room for possible variations due to operating point conditions (such as illustrated in FIGS. 6A, 6B).

A system formed in accordance with the present invention offers numerous advantages. For instance, capacitance does not have significant temperature coefficient, hence productively exploiting parasitic capacitance to provide offset correction guards against undue drift of the realized correction with temperature. In addition, since the parasitic capacitances of inactive compensation cells are connected to ground via offset switches, and since the residual capacitance remaining parasitically coupled to the input stage sampling node in that case remains relatively low (on the order of tens of attoFarads in the example shown), loading on the preceding stage is minimized.

Figure 4:
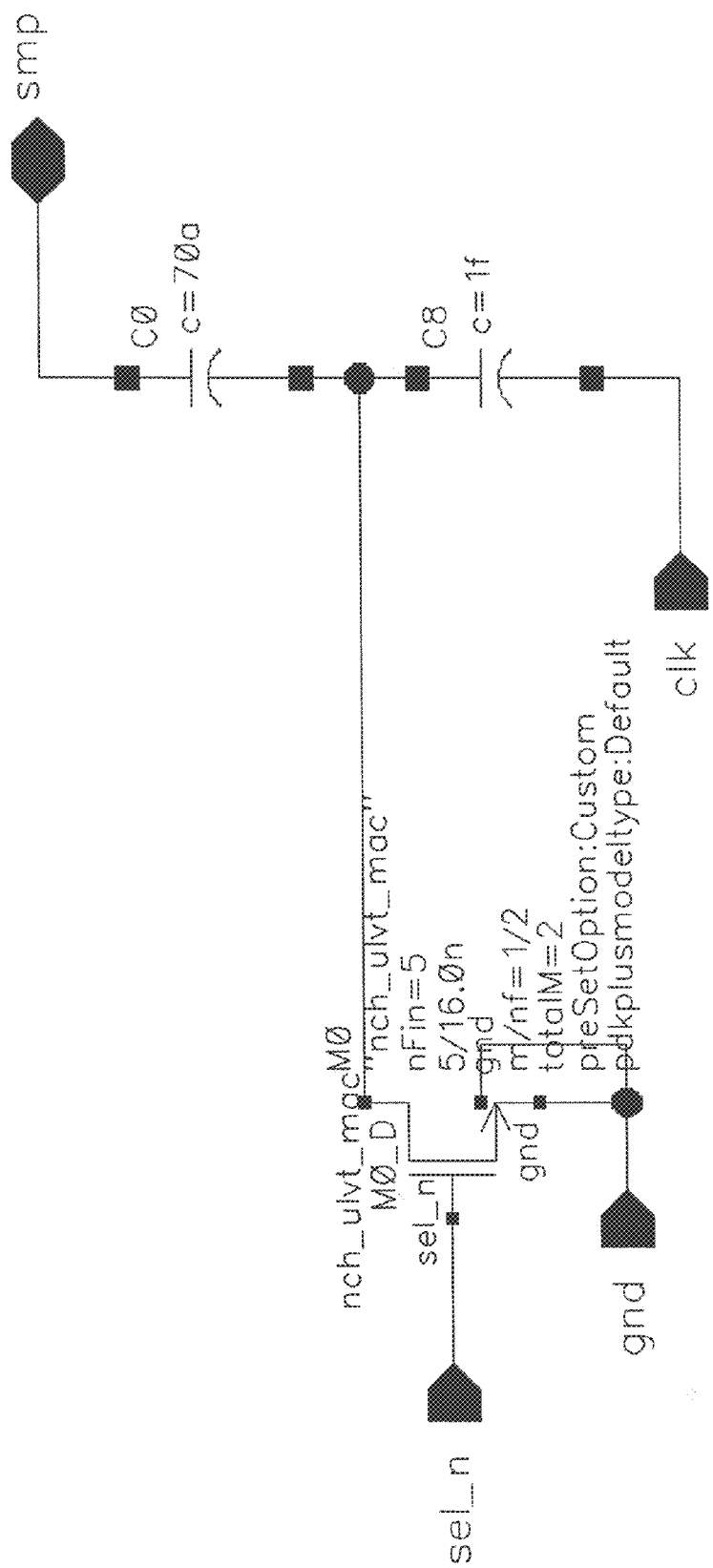
FIG. 4 is an annotated schematic diagram illustrating one example of a layout extracted for use in a sample application of the embodiment shown in FIG. 1.

As noted in preceding paragraphs, the compensation cell(s) is preferably extracted in layout using a suitable electromagnetic field solver. One example of such extracted layout for a compensation cell of the bipolar (+/−) single bit system embodiment 10 of FIGS. 1-2 is illustrated in FIG. 4. The illustrated values of certain physical parameters relating to the sample layout extracted are indicated as shown. This is but one of numerous examples of layouts which may be extracted for different embodiments, and even for different applications and uses of the same system embodiment.

Figure 5D:
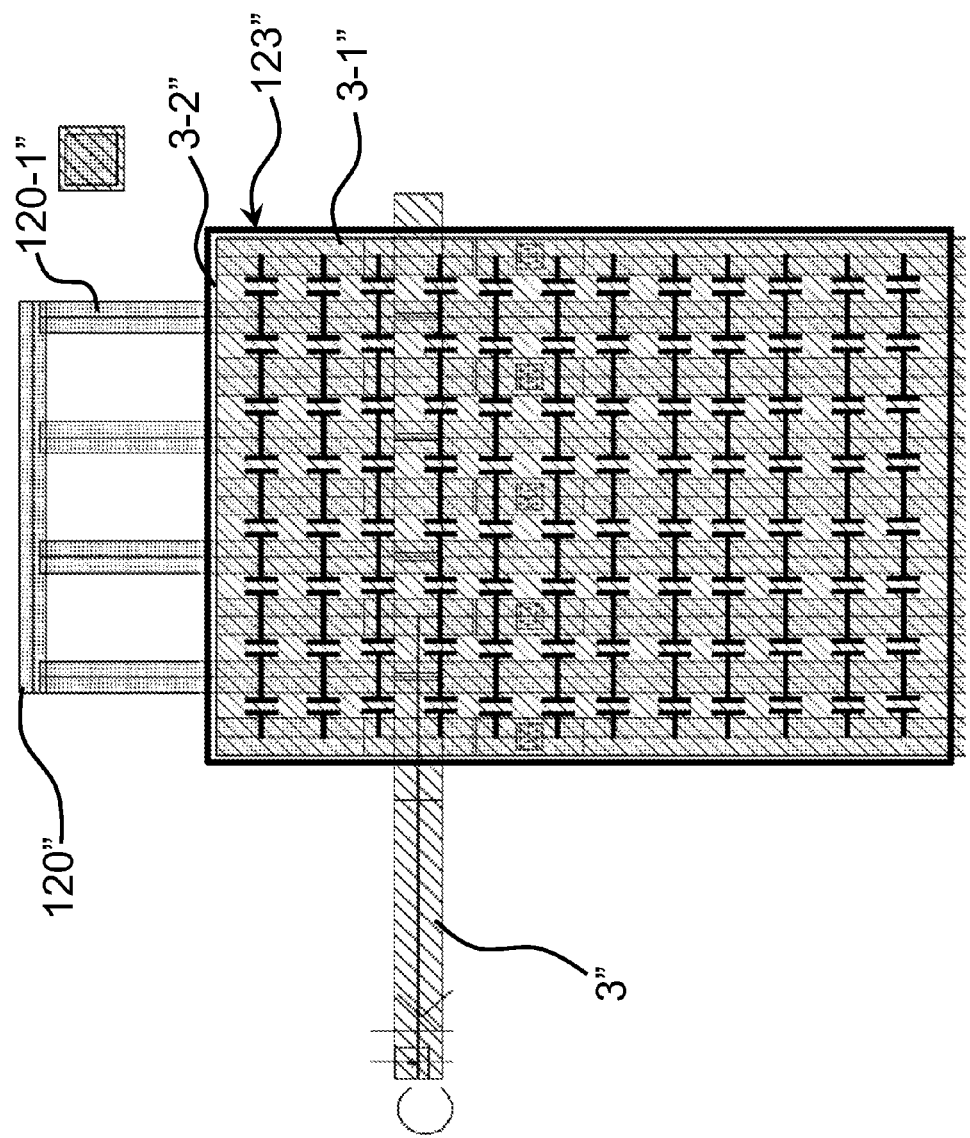
FIG. 5D is a zoomed in, partially cut away, view of the physical layout graphically represented in FIG. 5A, shown with explanatory graphic annotation at another portion of the view.

Turning now to FIGS. 5A-5D, there is shown a graphic representation of one example by which an extracted layout of a compensation cell 12 may be physically implemented in printed or other integrated circuit form having one or more substrate layers/levels. FIG. 5A shows a highly magnified graphic representation of but one physically implemented cell 12", though there may be others of like or different configuration employed in the exemplary system implementation 10". FIG. 5B illustrates in schematic diagram form the elements and interconnections of the corresponding portion of system embodiment 10 (as illustrated in FIG. 1). For clarity, the minus- and plus-side designating letters 'a' and 'b' are dropped from the reference characters shown in FIG. 5B, as the compensation cell circuitry shown is applicable to either side's input stage.

In the physical implementation example of FIG. 5A, the sampling node 7 (or node A of the input stage which the compensation cell 12 is coupled to) is implemented as an elongate metallic trace 7" formed on one substrate level. The trace 7" is shown in the magnified view of FIG. 5A as a horizontally extended rectangular conductive member. The control node 3 for receiving a clock signal clk is implemented in this example by the combination of an elongate metallic trace 3" formed at one substrate level, a plurality of elongate metal traces 3-1" formed on the same substrate level as the traces 120-1" of the isolation node (described in the following paragraph), and a metallic plate 3-2" formed on one or more other substrate levels. The constituent conductive members of the control node 3 disposed at different substrate levels are interconnected through a plurality of vias 3-3" passing therebetween. The metallic members 3", 3-2" of the control node 3 for the clock signal one or more substrate levels removed from the metallic members of the isolation node 120 (A), are formed in this example to overlay a substantial portion of those isolation node members.

In the example shown, the isolation node 120 is implemented in part by an elongate metallic trace 120" formed to extend (horizontally in the given view) on the same substrate level as the sampling node member 7". The isolation node 120 is implemented to also include a plurality of metallic traces 120-1" extending transversely (vertically in the given view) from the trace 120", interconnected thereto. The transversely extended traces 120-1" are interconnected by a plurality of vias 120-2" to a metallic trace extension 122-1" of the isolation switch 122. The isolation switch 122 is implemented by a suitable grounding switch structure which operates to selectively connect or disconnect the metallic trace 122-1" to/from a ground plane 9". The grounding switch structure 122" may be of any suitable structure known in the art, and is not described in further detail here.

As described in preceding paragraphs, the first and second parasitic capacitances 123, 127 are established in a compensation cell 12 respectively between the isolation and control nodes 120, 3 and between the isolation and sampling nodes 120, 7. In the physical layout example of FIG. 5A, the first parasitic capacitance 123 is established collectively by the various stray capacitance effects across the spacing between the isolation node traces 120-1" and the various control node traces and plate(s) 3", 3-1", 3-2". This is illustrated in the annotated view of FIG. 5D which zooms in on a portion of the physical layout example shown in FIG. 5A and schematically indicates the combination of stray capacitances effects which collectively define the effective parasitic capacitance 123".

Similarly, FIG. 5C zooms in on that portion of the physical layout example shown in FIG. 5A which establishes the second parasitic capacitance 127" across the spacing between the isolation node trace 120" and the adjacent sampling node trace 7". The graphic annotation shown in FIG. 5C schematically indicates the combination of stray capacitance effects at this portion which collectively define the second parasitic capacitance 127". As the graphic annotations in FIGS. 5C and 5D indicate, the stray capacitance effects arising during system operation between the isolation node and control node conductive members (both between conductive members laid out on the same substrate plane and between conductive members laid out on different substrate planes) far exceed in volume and density the parasitic effects arising between the isolation node and sampling node conductive members. This results in the wide difference in capacitance levels respectively established for the first and second parasitic capacitances 123", 127" (approximately 1 fF and 70 aF, respectively, in the sample case illustrated).

The relative sizing of these parasitically established capacitance levels—relative to one another, and to the hold capacitance of the given input stage (connected to the sampling node 7)—may be suitably varied depending on the requirements of a particularly intended embodiment and application. The established values, and the shapes, dimensions, and arrangements of the physically implemented layout components which establish them, may likewise be varied in suitable manner, depending on the requirements of a particularly intended embodiment and application.

FIGS. 6A and 6B graphically illustrate sample results obtained from simulated operation of the system embodiment 10', such as illustrated in FIG. 3. For this sample operation, the system 10' was equipped with sufficient number of compensation cells 12a', 12b' to provide four segmented levels of offset correction over a voltage compensation range spanning approximately 40 mV. The graphic plots 60, 62, 64 illustrate the degree of offset correction applied for the number of compensation segments programmably activated. FIG. 6A illustrates the degree of offset correction applied at the minus-side input stage, with the offset compensation of the plus-side input stage wholly deactivated. Conversely, FIG. 6B illustrates the degree of offset correction applied at the plus-side input stage, with the minus-side offset compensation wholly deactivated.

In each of the FIGS. 6A, 6B, graphic plots for three separate cases are illustrated, namely: case 60 where the input signal is taken from a given differential signal having a common mode voltage Vcm biased upward by 50 mV; case 62 where the input signal is taken from the given differential signal at its unbiased common mode voltage Vcm; and, case 64 where the input signal is taken from the differential signal at its common mode voltage Vcm biased downward by 50 mV. The various graphic plots demonstrate the range of adaptivity which may be realized in programmably controlled manner despite the use of stray parasitic capacitance effects in this regard.

Figure 7:
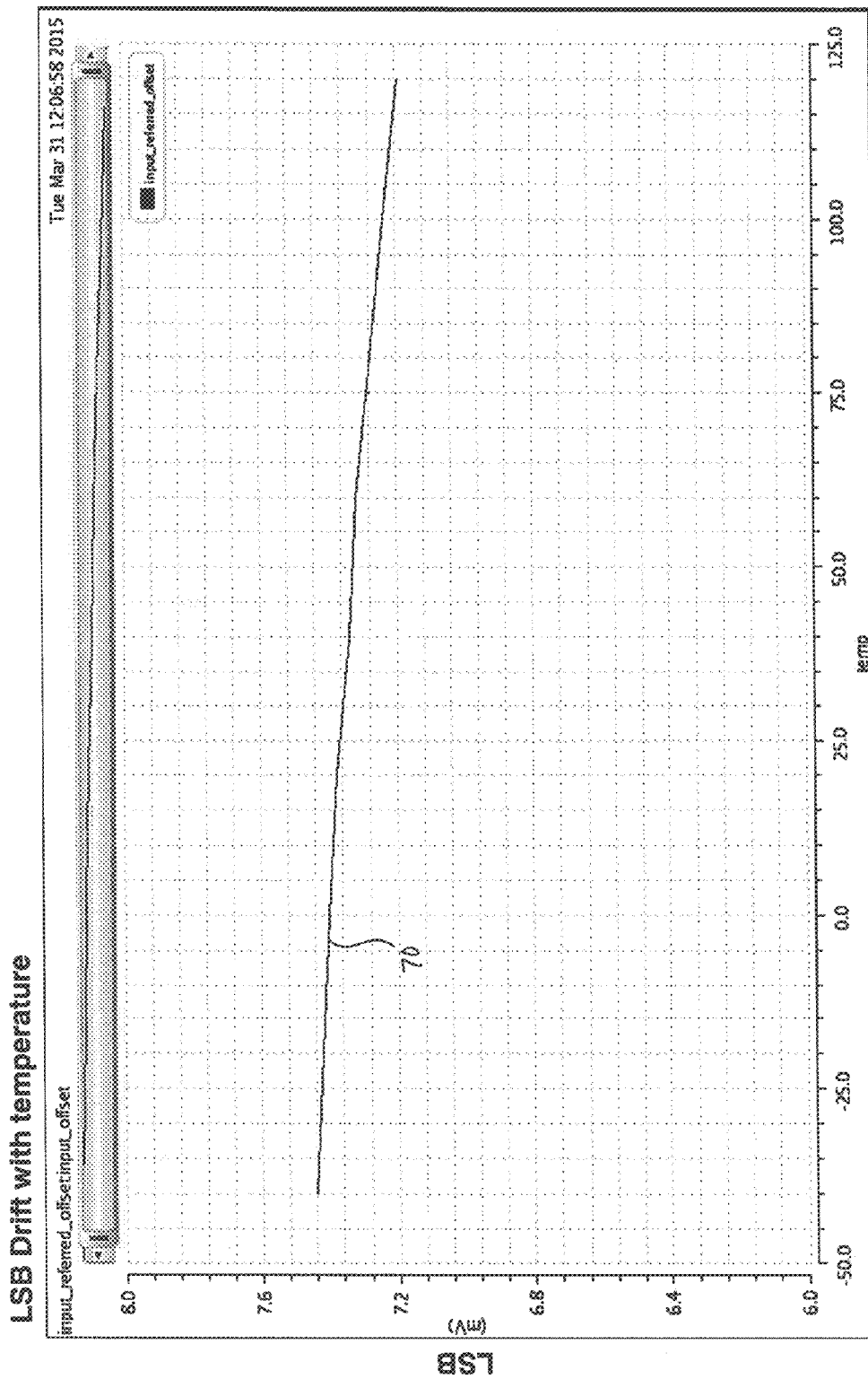
FIG. 7 is a graphic plot of results obtained from simulated sample operation of the embodiment shown in FIG. 3, demonstrating limited temperature drift in offset cancellation voltage provided by one activated compensation cell for an input stage; and, FIG. 8 is a schematic diagram illustrating a conventional approach to cancelling voltage offset of a comparator circuit.
Figure 8:
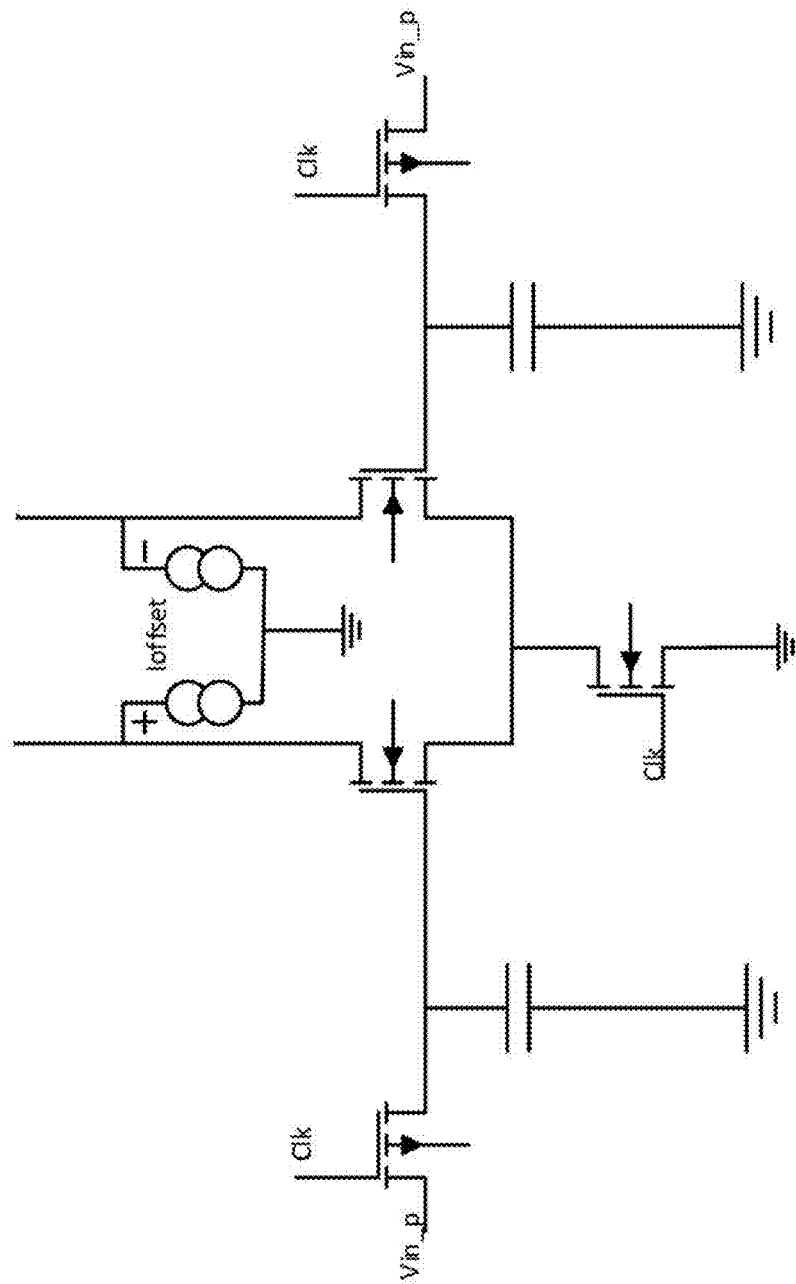

FIG. 7 illustrates another graphic plot resulting from simulated operation of the system embodiment 10', much as in FIGS. 6A, 6B. In this graphic plot 70, the LSB, or least significant bit increment of compensatory voltage adjustment applied at an input stage by one compensation cell is plotted in value across a range of temperature values. In the illustrated case, the voltage adjustment applied by the activated compensation cell measured approximately 7.44 mV at a temperature of approximately −40.0° C. Graphic plot 70 demonstrates that as the temperature is raised to approximately 120.0° C., the applied voltage adjustment decreases to just below 7.2 mV. This amounts to less than 4% drift in the applied voltage adjustment value over a drift in temperature of 160° C. The parasitic compensation carried out by an activated compensation cell is thus demonstrated to be highly immune to temperature drift.

Although this invention has been described in connection with specific forms and embodiments thereof, it will be appreciated that various modifications other than those discussed above may be resorted to without departing from the spirit or scope of the invention as defined in the appended claims. For example, functionally equivalent elements or processes may be substituted for those specifically shown and described, certain features may be used independently of other features, and in certain cases, particular locations of the elements or processes may be reversed or interposed, all without departing from the spirit or scope of the invention as defined in the appended claims.

What is claimed is:

1. A system for selectively coupled parasitic compensation for input referred voltage offset in an electronic circuit, comprising:
   (a) at least one input stage for the electronic circuit, each said input stage including:
      a sampling switch controlled by a periodic control signal applied thereto at a control node to selectively pass an input signal to a sampling node; and,
      a hold capacitance element coupled between said sampling node and a voltage reference node; and,
   (b) at least one compensation cell coupled to each said input stage, said compensation cell including:
      an isolation node disposed in spaced manner from said control and sampling nodes, said isolation node configured to form first and second parasitic capacitance elements respectively with said control and sampling nodes during system operation; and,
      an offset switch coupled to said isolation node and selectively set between first and second switching states;
      wherein said offset switch in said first switching state maintains a series coupling of the first and second parasitic capacitance elements between said control and sampling nodes, said sampling node being thereby adaptively adjusted in voltage by a predetermined portion of the control signal; and, said offset switch in said second switching state coupling each of the first and second parasitic capacitance elements to said voltage reference node to interrupt the series coupling thereof.

2. The system as recited in claim 1, comprising at least two differentially paired input stages coupled to respective sampling nodes.

3. The system as recited in claim 1, wherein said control signal is a digital clock signal, and said sampling switch of said input stage includes at least one P-channel MOSFET device.

4. The system as recited in claim 1, wherein said voltage reference node is coupled to an electrically grounded portion of the system.

5. The system as recited in claim 1, comprising a plurality of said compensation cells for each said input stage, said compensation cells being enabled in different combinations by selectively setting said offset switches thereof to programmably adjust said sampling node in voltage by a corresponding portion of the control signal.

6. The system as recited in claim 1, wherein said isolation node of said compensation cell is defined by at least one metallic trace formed on a first integrated circuit substrate in predetermined geometric configuration and arrangement with respect to said control and sampling nodes.

7. The system as recited in claim 6, wherein said isolation node includes:
 a set of first metallic traces arranged in substantially parallel mutual arrangement and interconnected by at least one transverse metallic trace; and,
 a set of second metallic traces arranged in substantially parallel mutual arrangement each disposed in spaced manner from said first metallic traces;
 wherein said offset switch is interconnected to said first metallic traces.

8. The system as recited in claim 7, wherein:
 said control node is defined by at least one metallic trace formed on a second integrated circuit substrate offset in circuit level from said first integrated circuit substrate;
 said sampling node is defined by at least one metallic trace formed on the said first integrated circuit level substrate substantially in parallel to said transverse metallic trace of said isolation node; and,
 the first parasitic capacitance element is formed between said first and second metallic traces of said isolation node and said metallic trace of said control node, said second parasitic capacitance element being formed between said transverse metallic trace of said isolation node and said metallic trace of said sampling node.

9. The system as recited in claim 8, wherein said first metallic traces of said isolation node are disposed in interposed relation to said second metallic traces thereof.

10. A system for programmable parasitic cancellation of input referred voltage offset in a printed electronic circuit having a predetermined layout of devices interconnected by nets routed on at least one circuit substrate, comprising:
 (a) at least one input stage for the printed electronic circuit, each said input stage including:
  a sampling switch controlled by a periodic clock signal applied thereto at a control node to selectively pass an input signal to a sampling node; and,
  a hold capacitance element coupled between said sampling node and a voltage reference node; and,
 (b) a plurality of compensation cells coupled to each said input stage, each said compensation cell including:
  an isolation node disposed in spaced manner from said control and sampling nodes, said isolation node configured to form first and second parasitic capacitance elements respectively with said control and sampling nodes during system operation, said isolation node being defined by at least one metallic trace formed on a first printed circuit substrate in predetermined geometric configuration and arrangement with respect to said control and sampling nodes; and,
  an offset switch coupled to said isolation node and selectively configured between first and second switching states, said offset switch in said first switching state maintaining a series coupling of the first and second parasitic capacitance elements between said control and sampling nodes, said sampling node being thereby adaptively adjusted in voltage by a predetermined portion of the clock signal, said offset switch in said second switching state coupling each of the first and second parasitic capacitance elements to said voltage reference node to interrupt the series coupling thereof;
 wherein said compensation cells being enabled in different combinations by selectively configuring said offset switches thereof to programmably adjust said sampling node in voltage by a corresponding portion of the clock signal.

11. The system as recited in claim 10, wherein said voltage reference node is coupled to an electrically grounded portion of the system.

12. The system as recited in claim 11, wherein said isolation node includes:
 a set of first metallic traces arranged in substantially parallel mutual arrangement and interconnected by at least one transverse metallic trace; and,
 a set of second metallic traces arranged in substantially parallel mutual arrangement each disposed in spaced manner from said first metallic traces;
 wherein said offset switch is interconnected to said first metallic traces.

13. The system as recited in claim 12, wherein said first metallic traces of said isolation node are disposed in interposed relation to said second metallic traces thereof.

14. The system as recited in claim 13, wherein:
 said control node is defined by at least one metallic trace formed on a second printed circuit substrate offset in circuit level from said first printed circuit substrate;
 said sampling node is defined by at least one metallic trace formed on the said first printed circuit level substrate substantially in parallel to said transverse metallic trace of said isolation node; and,
 the first parasitic capacitance element is formed between said first and second metallic traces of said isolation node and said metallic trace of said control node, said second parasitic capacitance element being formed between said transverse metallic trace of said isolation node and said metallic trace of said sampling node.

15. The system as recited in claim 14, wherein said clock signal is a digital clock signal, and said sampling switch of said input stage includes at least one P-channel MOSFET device.

16. The system as recited in claim 15, comprising at least two differentially paired input stages coupled to respective sampling nodes.

17. A method for selectively coupled parasitic compensation of input referred voltage distortion in an electronic circuit, comprising:
 establishing at least one input stage for the electronic circuit, each said input stage including a sampling switch coupled to a control node and a hold capacitance element coupled between a sampling node and a voltage reference node;
 establishing an isolation node to be disposed in spaced manner from each of said control and sampling nodes;
 geometrically configuring and arranging said isolation node to form during system operation a first parasitic capacitance element with said control node and a second parasitic capacitance element with said sampling node; and,
 establishing an offset switch coupled to said isolation node, said offset switch being selectively configured between first and second switching states to form a compensation cell for said input stage;
 applying a periodic clock signal at said control node to actuate said sampling switch for selectively passing an input signal to said sampling node;
 selectively setting said offset switch to said first switching state to maintain a series coupling of the first and second parasitic capacitance elements between said control and sampling nodes, whereby said sampling node is adaptively adjusted in voltage by a predetermined portion of the clock signal; and,
 alternatively actuating said offset switch to said second switching state to couple each of the first and second parasitic capacitance elements to said voltage reference node and thereby interrupt the series coupling thereof.

18. The method as recited in claim 17, wherein said voltage reference node is coupled to an electrically grounded portion; a plurality of said compensation cells are established for each said input stage; and, said compensation cells are enabled in different combinations by selectively setting said offset switches thereof to programmably adjust said sampling node in voltage by a corresponding portion of the clock signal.

19. The method as recited in claim 17, wherein said isolation node of said compensation cell is defined by printing at least one metallic trace on a first integrated circuit substrate in predetermined geometric configuration and arrangement with respect to said control and sampling nodes by executing an electromagnetic field solver.

20. The method as recited in claim 19, wherein:
said isolation node is configured to include:
a set of first metallic traces arranged in substantially parallel mutual arrangement and interconnected by at least one transverse metallic trace; and,
a set of second metallic traces arranged in substantially parallel mutual arrangement each disposed in spaced manner from said first metallic traces;
said offset switch is interconnected to said first metallic traces;
said control node is defined by printing at least one metallic trace on a second integrated circuit substrate offset in circuit level from said first integrated circuit substrate;
said sampling node is defined by printing at least one metallic trace on the said first integrated circuit level substrate substantially in parallel to said transverse metallic trace of said isolation node; and,
the first parasitic capacitance element is formed between said first and second metallic traces of said isolation node and said metallic trace of said control node, said second parasitic capacitance element being formed between said transverse metallic trace of said isolation node and said metallic trace of said sampling node.

* * * * *